US010692970B2

(12) United States Patent
Kowalik-Seidl et al.

(10) Patent No.: US 10,692,970 B2
(45) Date of Patent: Jun. 23, 2020

(54) SEMICONDUCTOR DEVICE WITH BUFFER REGION

(71) Applicant: Infineon Technologies Dresden GmbH & Co. KG, Dresden (DE)

(72) Inventors: Katarzyna Kowalik-Seidl, Unterhaching (DE); Ayad Abdul-Hak, Dresden (DE); Olaf Fiedler, Dresden (DE); Richard Hensch, Dresden (DE); Markus Schmitt, Neubiberg (DE); Daniel Kai Simon, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 16/191,088

(22) Filed: Nov. 14, 2018

(65) Prior Publication Data

US 2019/0148484 A1 May 16, 2019

(30) Foreign Application Priority Data

Nov. 15, 2017 (DE) .......................... 10 2017 126 853

(51) Int. Cl.
*H01L 29/06* (2006.01)
*H01L 29/08* (2006.01)
(Continued)

(52) U.S. Cl.
CPC ...... *H01L 29/0634* (2013.01); *H01L 29/0878* (2013.01); *H01L 29/36* (2013.01);
(Continued)

(58) Field of Classification Search
CPC ............... H01L 29/0615; H01L 29/063; H01L 29/0634; H01L 29/0878; H01L 29/7802;
(Continued)

(56) References Cited

U.S. PATENT DOCUMENTS

2006/0033153 A1 2/2006 Onishi et al.
2009/0057713 A1* 3/2009 Hirler ................. H01L 29/1095
257/143

(Continued)

FOREIGN PATENT DOCUMENTS

DE 102014101164 A1 7/2014

*Primary Examiner* — Hsien Ming Lee
(74) *Attorney, Agent, or Firm* — Murphy, Bilak & Homiller, PLLC

(57) ABSTRACT

A semiconductor device include a semiconductor body with a drain region of a first conductivity type, a drift region of the first conductivity type and having a doping concentration lower than a doping concentration of the drain region, a buffer region of the first conductivity type arranged between the drift region and the drain region, a source region of the first conductivity type, a body region of a second conductivity type arranged between the source region and the drift region and forming a first pn-junction with the source region and a second pn-junction with the drift region, and a charge compensation region of the second conductivity type extending from the body region towards the buffer region. A source metallization is in ohmic contact with the source region. A drain metallization is ohmic contact with the drain region.

17 Claims, 7 Drawing Sheets

(51) Int. Cl.
   *H01L 29/36* (2006.01)
   *H01L 29/78* (2006.01)
   *H01L 29/417* (2006.01)

(52) U.S. Cl.
   CPC ...... *H01L 29/7802* (2013.01); *H01L 29/0692* (2013.01); *H01L 29/41766* (2013.01)

(58) Field of Classification Search
   CPC  H01L 29/402; H01L 29/0684; H01L 29/0692
   See application file for complete search history.

(56) References Cited

U.S. PATENT DOCUMENTS

2015/0116031 A1    4/2015  Wahl et al.
2016/0293692 A1   10/2016  Sakata et al.

* cited by examiner

SEMICONDUCTOR DEVICE WITH BUFFER REGION

TECHNICAL FIELD

Embodiments described herein relate to semiconductor devices with a buffer region, particularly to superjunction semiconductor devices with a buffer region having at least three sub-regions with different doping concentration.

BACKGROUND

Demanding requirements on the reliability of semiconductors in automotive applications are the driving force for the development of new power MOSFETs technologies. The electronics in a vehicle has to operate without failure over 15 years under harsh external conditions. Wide temperature ranges (−40° C. up to 150'C) and high exposure on cosmic radiation (CR) at higher altitudes challenges the development.

Adapted device designs may improve MOSFET robustness and reliability. However, improved reliability through adapting the design of the device often leads to degradation of important electrical parameters of the device or cause an unacceptable increase in the production costs.

In view thereof, there is need for improvement.

SUMMARY

According to an embodiment, a semiconductor device includes a semiconductor body having a drain region of a first conductivity type, a drift region of the first conductivity type with a doping concentration lower than a doping concentration of the drain region, a buffer region of the first conductivity type and arranged between the drift region and the drain region, a source region of the first conductivity type, a body region of a second conductivity type, wherein the body region is arranged between the source region and the drift region and forms a first pn-junction with the source region and a second pn-junction with the drift region, and a charge compensation region of the second conductivity type, wherein the charge compensation region extends from the body region towards the buffer region. The semiconductor device further includes a source metallization in ohmic contact with the source region, and a drain metallization in ohmic contact with the drain region. The buffer region includes at least a lower sub-region adjoining the drain region, wherein the lower sub-region has a doping concentration equal to or higher than $5 \times 10^{16}$ cm$^{-3}$ and equal to or lower than $8 \times 10^{17}$ cm$^{-3}$, an upper sub-region adjoining the drift region, wherein the upper sub-region has a doping concentration of equal to or higher than $1 \times 10^{15}$ cm$^{-3}$ and equal to or lower than $1 \times 10^{16}$ cm$^{-3}$, and a middle sub-region arranged between the lower sub-region and the upper sub-region, wherein the middle sub-region has a doping concentration of equal to or higher than $5 \times 10^{15}$ cm$^{-3}$ and equal to or lower than $5 \times 10^{16}$ cm$^{-3}$.

According to a further embodiment, a semiconductor device includes a semiconductor body with a drain region of a first conductivity type; a drift region of the first conductivity type and having a doping concentration lower than a doping concentration of the drain region; a buffer region of the first conductivity type and arranged between the drift region and the drain region; a source region of the first conductivity type; a body region of a second conductivity type and being arranged between the source region and the drift region and forming a first pn-junction with the source region and a second pn-junction with the drift region; and a charge compensation region of the second conductivity type and region extending from the body region towards the buffer region. The semiconductor device further includes a source metallization in ohmic contact with the source region, and a drain metallization in ohmic contact with the drain region. The buffer region includes at least a lower sub-region adjoining the drain region, wherein the lower sub-region has a thickness of equal to or higher than 3 μm and equal to or lower than 12 μm and has a doping concentration lower than the doping concentration of the drain region, an upper sub-region adjoining the drift region, wherein the upper sub-region has a thickness of equal to or higher than 3 μm and equal to or lower than 10 μm, and a middle sub-region arranged between the lower sub-region and the upper sub-region, wherein the middle sub-region has a thickness of equal to or higher than 8 μm and equal to or lower 20 μm and has a doping concentration lower than the doping concentration of the lower sub-region and higher than the doping concentration of the upper sub-region.

According to a further embodiment, a semiconductor device includes a semiconductor body with a drain region of a first conductivity type; a drift region of the first conductivity type and having a doping concentration lower than a doping concentration of the drain region; a buffer region of the first conductivity type and being arranged between the drift region and the drain region and forming an upper interface with the drift region and a lower interface with the drain region; a source region of the first conductivity type; a body region of a second conductivity type and being arranged between the source region and the drift region and forming a first pn-junction with the source region and a second pn-junction with the drift region; and a charge compensation region of the second conductivity type and extending from the body region towards the buffer region. The semiconductor device further includes a source metallization in ohmic contact with the source region, and a drain metallization in ohmic contact with the drain region. The buffer region has a thickness of equal to or higher than 14 μm and equal to or lower than 42 μm, wherein the buffer region has a doping concentration which monotonically increases from the upper interface to the lower interface.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings.

DETAILED DESCRIPTION

In the following detailed description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical", "under", "below", "lower", "over", "upper" etc., is used with reference to the orientation of the figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

In this specification, a second surface of a semiconductor substrate or of a semiconductor body is considered to be formed by the lower or back-side surface while a first surface is considered to be formed by the upper, front or main surface of the semiconductor substrate and of the semiconductor body, respectively. The terms "above" and "below" as used in this specification therefore describe a relative location of a structural feature to another structural feature with consideration of this orientation.

The terms "electrical connection" and "electrically connected" describes an ohmic connection between two elements.

In the present embodiments, the first conductivity type is of n-type while the second conductivity type is of p-type without being limited thereto.

Figure 1:
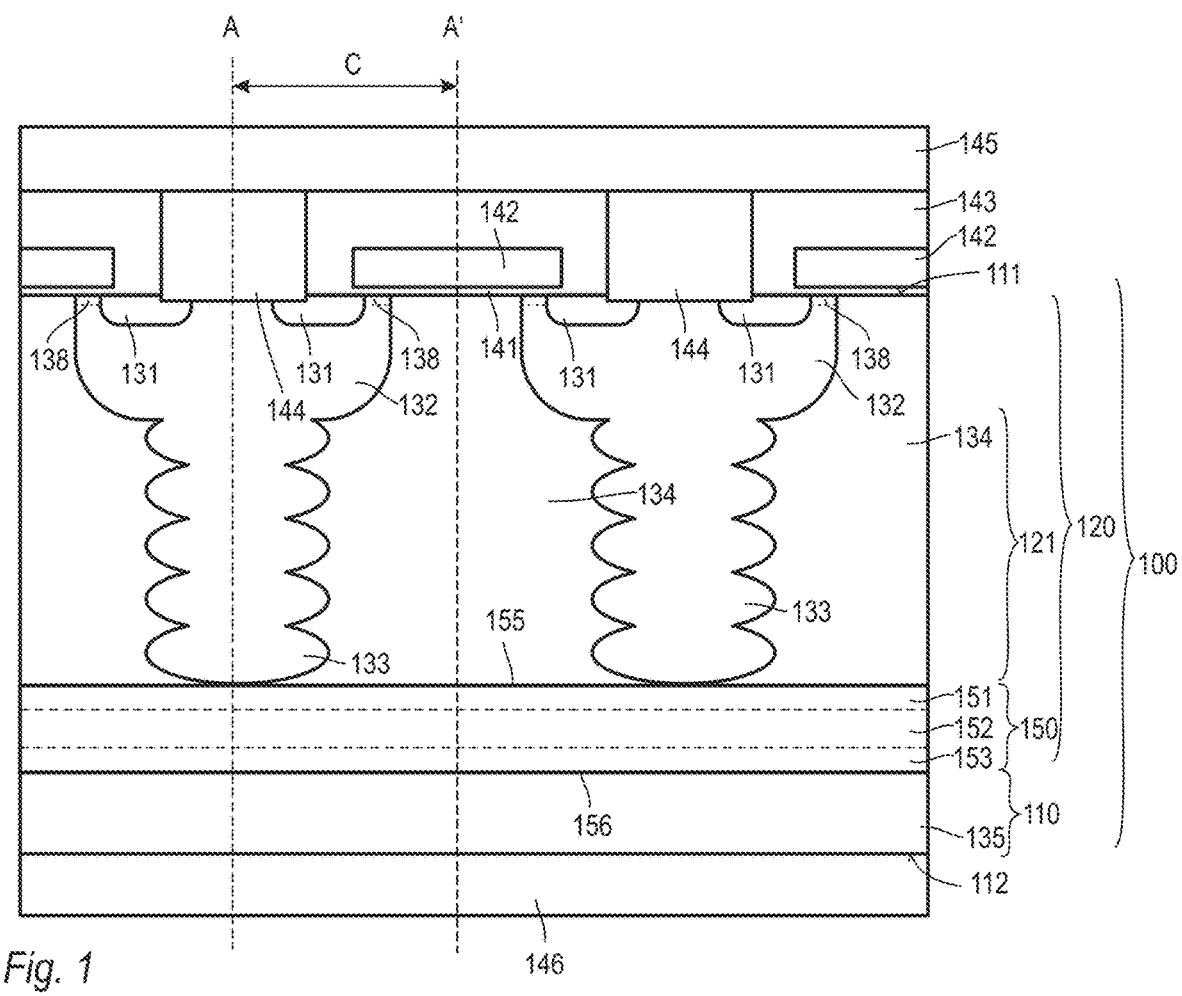
FIG. 1 illustrates a semiconductor device according to an embodiment.

FIG. 1 illustrates a semiconductor device according to an embodiment. The semiconductor device may include a semiconductor body 100 having a first side 111 and a second side 112 opposite the first side 111. The first side 111 may be regarded as main side of the semiconductor device. The semiconductor body 100 can include a semiconductor substrate 110 and an epitaxial layer 120 formed on the semiconductor substrate 110. An exposed side of the semiconductor substrate 110 may form the second side 112 of the semiconductor body 100. An exposed side of the epitaxial layer 120 may form the first side 111 of the semiconductor body 100.

The semiconductor body 100 can be made of any semiconductor material suitable for manufacturing semiconductor components. Typical examples of such material include, without being limited thereto, elementary semiconductor materials such as silicon (Si) and binary III-V semiconductor materials such as gallium nitride (GaN). For power semiconductor applications currently mainly Si, SiC, GaAs and GaN materials are used. In the present embodiment, the semiconductor substrate is Si.

According to an embodiment, the semiconductor device is a power semiconductor device, particularly a unipolar field-effect transistor such as a metal oxide semiconductor field effect transistor (MOSFET).

The semiconductor substrate 110 may form or include a drain region 135 of the semiconductor device. The drain region 135 can be, for example, a highly doped region of a first conductivity type. According to an embodiment, the drain region 135 has a doping concentration higher than $8 \times 10^{17}$ cm$^{-3}$, particularly equal to or higher than $1 \times 10^{18}$ cm$^{-3}$, and more particularly equal to or higher than $1 \times 10^{19}$ cm$^{-3}$.

The epitaxial layer 120 can include a buffer region 150, which can be in direct contact with the drain region 135 formed in the semiconductor substrate 110. The buffer region 150 may be completely formed within the epitaxial layer 120 and may extend to the interface between the epitaxial layer 120 and the semiconductor substrate 100.

The buffer region 150 may be formed as a single large doping region which continuously extends in lateral direction without being interrupted by doping regions of opposite conductivity type. The doping concentration of the buffer region 150 can be constant in lateral direction.

According to an embodiment, the buffer region 150 is of the first conductivity type and may have a step-wise reducing doping concentration from the drain region 135 in the direction toward the first side 111 of the semiconductor body 110, i.e. the doping concentration changes in vertical direction.

The epitaxial layer 120 may also include a body region 132 of a second conductivity type opposite to the first conductivity type, a source region 131 of the first conductivity type, and a charge compensation region 133 of the second conductivity type. The charge compensation region 133 is formed below the body region 132 as an extension of the body region 133 toward the drain region 135. Body region 132 and charge compensation region 133 are in ohmic connection and forming together a common doping region of the second conductivity type.

A first pn-junction is formed between the body region 132 and the source region 131. A second pn-junction is formed between the body region 132 and charge compensation region 133, and the drift region 134. The second pn-junction can be described as having a first portion between the body region 132 and the drift region 134, and a second portion between the charge compensation region 133 and the drift region 134.

FIG. 1 illustrates a semiconductor device having a plurality of transistor cells. Each transistor cell C, illustrated between the two vertically running dashed lines A and A', includes a source region 131, a body region 132, a charge compensation region 133, a drift region 134, a buffer region 150, and a drain region 135. A transistor cell C may be defined as a functional transistor unit having a single continuous and connected channel region 138. A channel region 138 is a region within the body region 132 next to the gate dielectric 141 and the gate electrode 142, the conductivity of which can be changed under the influence of the electrical field generated between the gate electrode 142 and the body region 132. Depending on the voltage applied between the gate electrode 142 and the body region 132, the conductivity of the channel region 138 changes from the second conductivity to the first conductivity which results in short-circuiting the first and the second pn-junctions.

Figure 2A:
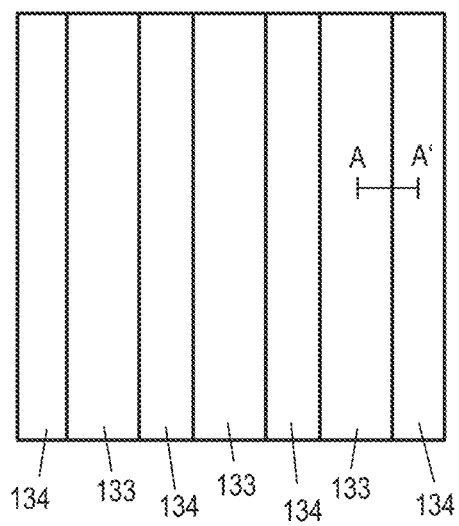
FIGS. 2A and 2B illustrate different cell layouts according to various embodiments.
Figure 2B:
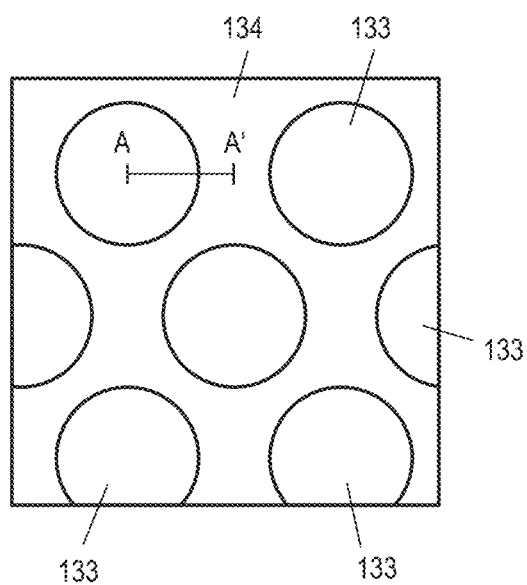

The transistor cells C can have a different layout when seen in plane projection onto the first side 111 of the semiconductor body 100. FIGS. 2A and 2B illustrate two examples of different cell layouts. FIG. 2A shows a so-called stripe design with alternating stripes of charge compensation region 133 and drift regions 134. For ease of illustration, only the charge compensation regions 133 and the drift regions 134 are shown. FIG. 2B shows a layout with a plurality of island-like charge compensation regions 133, which can be arranged, for example, in columns and lines, in diagonally running lines, or in a hexagonal arrangement, when seen in plan projection onto the first side 111. The charge compensation regions 133 shown in FIG. 2B have an outer circular shape, when seen in plan projection onto the first side 111 of the semiconductor body 110. The charge compensation regions 133 can also have, however, a square like shape or a hexagonal shape, or an oblong rectangular shape. When seen in a vertical cross-section, each transistor cell may have a layout as illustrated between the two vertically running dashed lines AA' illustrated in FIG. 1, without being limited thereto. The location of the respective cross-section between the lines AA' is indicated in FIGS. 2A and 2B, respectively.

The charge compensation regions 133 may have a stripe shape and extending parallel to and alternating with the drift region 134 when seen onto the first side 111. Each charge compensation region 133 may also have a column-like shape when seen in a vertical cross-section. In a vertical cross-section through the semiconductor device, charge compensation regions 133 alternate with drift regions 134. The doping relations of the charge compensation regions 133 and of the drift regions 134 are adapted to each other so that, under reverse operation conditions, both regions are depleted. This improves the blocking capabilities of the semiconductor device while allowing to increase the doping concentration of the drift regions 134 resulting in a lower specific on-state resistance Ron·A.

Figure 3:
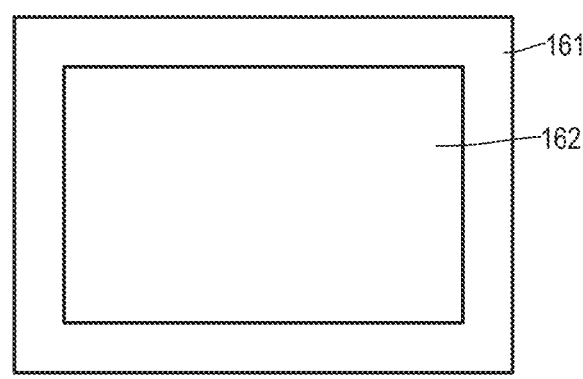
FIG. 3 illustrates a top view of a semiconductor device according to an embodiment.

The specific on-state resistance Ron·A is defined as the product between the on-state resistance Ron and the area A of the active area of the semiconductor device. The on-state resistance Ron is often referred to as drain-to-source on-state resistance $R_{DS(on)}$. In the following, only on-state resistance Ron is used. The active area of the semiconductor device is that area which actually carries the load current. Power semiconductor devices include an active area which is laterally surrounded by a so-called peripheral area or edge termination region. FIG. 3 illustrates a schematic view onto a semiconductor chip in which a device, such as a power device, is integrated. The active area is denoted by 162 and the peripheral area is denoted by 161. The peripheral area, or edge termination region 161, does not contribute to the current flow through the semiconductor device. The main purpose of the edge termination region is to relieve the electrical field at the outer edge of the semiconductor device in a controlled manner.

The charge compensation region 133 and the drift region 134 adjoining the charge compensation region 133 form together a charge compensation structure 121. Semiconductor devices having charge compensation structures 121 are also referred to as superjunction devices due to the enlarged second pn-junction between the charge compensation region 133 and the drift region 134. The alternating arrangement of charge compensation regions 133 and drift region 134 provides improved depletion of the drift regions 134.

Due to the alternating arrangement of the charge compensation regions 133 and the drift regions 134, when seen in a vertical cross-section, the charge compensation regions 133 are also referred to as p-columns and the drift regions 134 are referred to as n-columns.

The charge compensation regions 133 and the drift regions 134 can be formed by step-wise deposition of epitaxial sub-layers followed by implantation of dopants into each epitaxial sub-layer after each deposition step. The implanted dopants are diffused into the respective epitaxial sub-layers by a thermal treatment to form the vertically extending charge compensation regions 133 and the vertically extending drift regions 134.

The drift region or drift regions 134 are defined to be the area which is arranged lateral between the charge compensation regions 133. The lower limit of the drift regions 134, as well as of the charge compensation regions 133, can be defined by the lower level or end of the second pn-junction, so that the drift regions 134 extends as deep as the charge compensation regions 133 but not deeper than the charge compensation regions 133. Both the charge compensation regions 133 and the drift regions 134 extend, in vertical direction, to the same depth relative to the first side 111. With reference to FIG. 1, the lower limit of the drift regions 134 and of the charge compensation regions 133 is the virtual line 155 which also defines an interface between the drift regions 134 and the buffer region 150.

The buffer region 150 includes, according to an embodiment, at least a lower sub-region 153 adjoining the drain region 135, an upper sub-region 151 adjoining the drift region 134, and a middle sub-region 152 arranged between the lower sub-region 153 and the upper sub-region 151. The buffer region 150 may have at least three sub-regions of different doping concentration with reducing doping concentration from the drain region 135 to the drift region 134.

According to an embodiment, the lower sub-region 153 has a doping concentration equal to or higher than $5\times10^{16}$ cm$^{-3}$ and equal to or lower than $8\times10^{17}$ cm$^{-3}$. The upper sub-region 152 can have a doping concentration of equal to or higher than $1\times10^{15}$ cm$^{-3}$ and equal to or lower than $1\times10^{16}$ cm$^{-3}$, and the middle sub-region 152 can have a doping concentration of equal to or higher than $5\times10^{15}$ cm$^{-3}$ and equal to or lower than $5\times10^{16}$ cm$^{-3}$.

The semiconductor device further includes a source metallization 145 which is in electrical (ohmic) contact with the source regions 131 through respective source contacts 144. The source contacts 144 can also electrically contact the body regions 132 so that source regions 131 and body regions 132 are basically at the same electrical potential during operation of the semiconductor device. An insulation layer 143 electrically insulates the gate electrodes 142 from the source metallization 145 and the source contacts 144. The insulation layer 143 covers the gate electrodes 142. The source contacts 144 extend through the insulation layer 143. The source metallization 145 is formed on the insulation layer 143. To reduce the resistance, the source metallization 145 is typically formed of a metal or metal alloy, for example containing aluminium and/or copper.

A drain metallization 146 is formed on the second side 112 of the semiconductor body 100 to be in ohmic contact with the drain region 135. The drain metallization 146 is also typically a metal or metal alloy, for example containing aluminium (Al), silver (Ag), nickel (Ni), vanadium (V), titanium (Ti), gold (Au), tin (Sn), and/or copper (Cu), or combinations or alloys thereof. Different metals and metal alloys can be used for the drain metallization 146 and the source metallization 145, respectively. An example is a metal stack of Al/Ti/NiV/AuSn, or a metal stack of Al/Ti/NiV/Ag.

According to an embodiment, the drift region 134 can have a doping concentration of equal to or higher than $2 \times 10^{15}$ cm$^{-3}$, particularly equal to or higher than $5 \times 10^{15}$ cm$^{-3}$, and more particularly equal to or higher than $9 \times 10^{15}$ cm$^{-3}$ such as equal to or higher than $2 \times 10^{16}$ cm$^{-3}$.

The doping concentration of the drift region 134 can be, for example, higher than the doping concentration of the upper sub-region 151 of the buffer region 150. Thus, the doping profile extending in vertical direction through the buffer region 150 and the drift region 134 can have a minimum at the junction between the buffer region 150 and the drift region 134. This junction is referred to as upper interface 155 of the buffer region 150. The buffer region 150 also has a junction with the drain region 135, which junction is referred to as lower interface 156 of the buffer region 150.

The upper interface 155 buffer region 150 may form also an interface with the charge compensation region 133.

The drain region 135 has typically a higher doping concentration than each of the drift region 134 and the buffer region 150 including any of the sub-regions 151, 152, 153 of the buffer region 150.

According to an embodiment, the doping concentration of the drift region 134 can be selected such that the semiconductor device has a specific on-state resistance Ron·A in the active area 162 of equal to or lower than 1 Ohm·mm$^2$, particularly equal to or lower than 0.8 Ohm·mm$^2$, more particularly equal to or lower than 0.6 Ohm·mm$^2$, even more particularly equal to or lower than 0.4 Ohm·mm$^2$, such as equal to or lower than 0.2 Ohm·mm$^2$, or equal to or lower 0.1 Ohm·mm$^2$. A low specific on-state resistance is desirable to reduce ohmic losses when the semiconductor device is rendered conductive and carries a load current.

Figure 4:
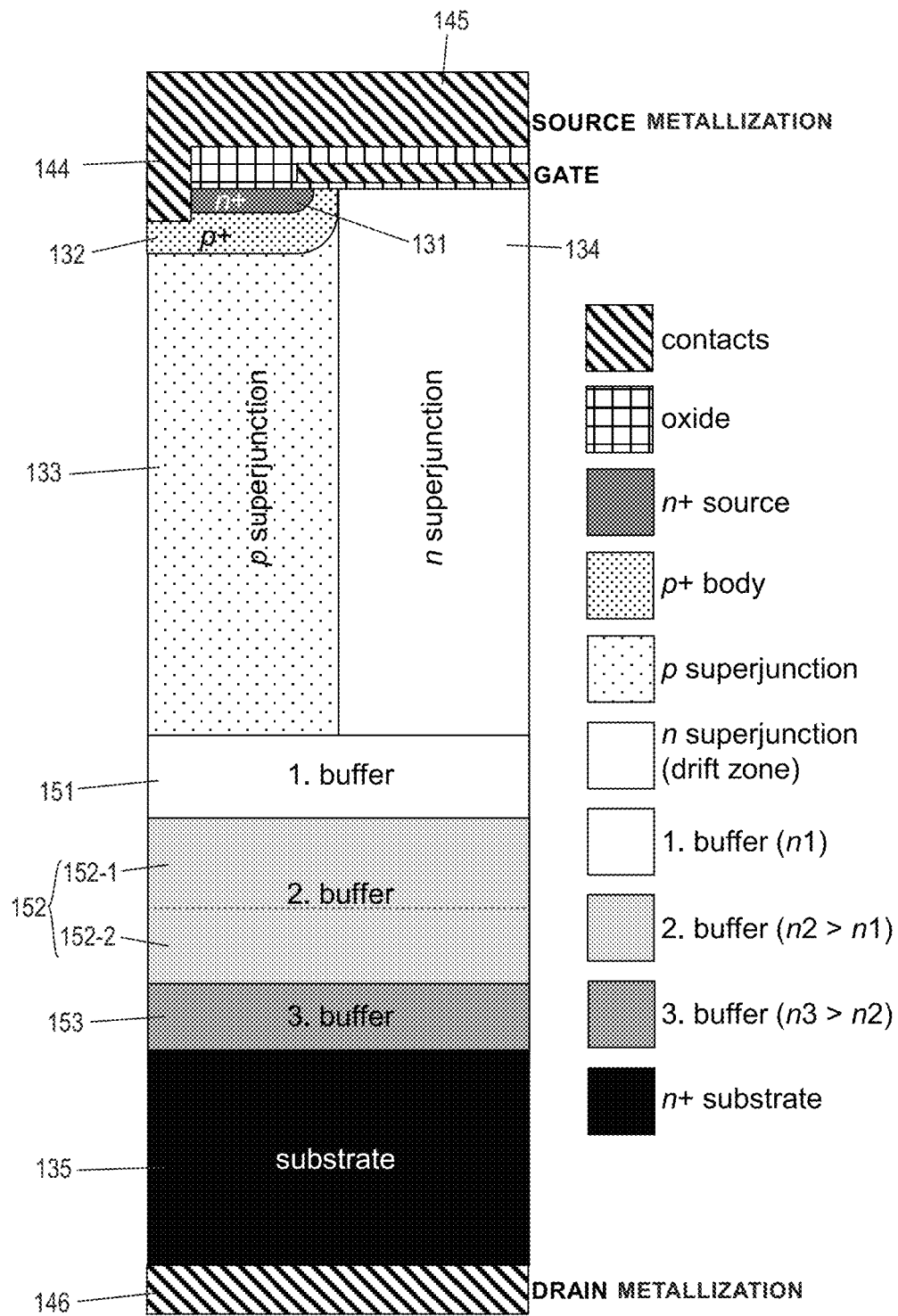
FIG. 4 illustrates a semiconductor device according to an embodiment.

FIG. 4 shows another illustration of a transistor cell including a drain metallisation in ohmic contact with the semiconductor substrate which forms the highly n-doped drain region 135. The buffer region 150 including the lower sub-region 153, which is described in FIG. 4 as third buffer, the middle sub-region 152, which is described in FIG. 4 as second buffer, and the upper sub-region 151, which is described in FIG. 4 as first buffer, is formed on and in contact with the drain region 135.

As illustrated in the cross-section of FIG. 4, both the p-doped charge compensation region 133, which is denoted in FIG. 4 as p-superjunction, and the n-doped drift region 134, which is denoted in FIG. 4 as n-superjunction, are formed as adjacent columns forming a vertical second pn-junction. Each of the p-doped charge compensation region 133 and the n-doped drift region 134 are in contact with the upper sub-region 151 of the buffer region.

The charge compensation region 133 is formed as a vertical extension of the body region 132. As illustrated in FIG. 4, the charge compensation region 133 can have a doping concentration lower than the doping concentration of the body region 132. The source region 131, which can be embedded in the body region 132, has typically a high doping concentration, which is significantly higher than the doping concentration of the drift region 134.

FIG. 4 illustrates a stepwise reduction of the doping concentration within the buffer region 150 with the lower sub-region 153 having the highest doping concentration among the sub-regions of the buffer region 150 and the upper sub-region 151 having the lowest doping concentration among the sub-regions of the buffer region 150.

According to an embodiment, the upper sub-region 151 of the buffer region 150 can have a thickness of equal to or higher than 3 µm and equal to or lower than 12 µm.

According to an embodiment, the middle sub-region 152 of the buffer region 150 can have a thickness of equal to or higher than 8 µm and equal to or lower than 20 µm.

According to an embodiment, the lower sub-region 153 of the buffer region 150 can have a thickness of equal to or higher than 3 µm and equal to or lower than 10 µm.

According to an embodiment, the middle sub-region 152 of the buffer region 150 may include at least a first region 152-1 adjoining the upper sub-region 151 and having a thickness of at least 3 µm, and a second region 152-2 adjoining the lower sub-region 153 and having a thickness of at least 3 µm. The doping concentration of the middle sub-region 152 typically increases from the first region 152-1 to the second region 152-2. The increase of the doping concentration can be, for example, stepwise or continuous. Typically, the first region 152-1 has a doping concentration higher than the doping concentration of the upper sub-region 151 but lower than the doping concentration of the lower sub-region 153. The second region 152-2 has a doping concentration higher than the doping concentration of the first region 152-1 but lower than the doping concentration of the lower sub-region 153.

It is also possible, that the middle sub-region 152 includes three regions of different doping concentrations. Typically, the doping concentration of the respective regions of the middle sub-region 152 increases from the upper sub-region 151 to the lower sub-region 153.

According to a further embodiment, the doping concentration of the buffer region 150 monotonically increases from the upper sub-region 151 to the lower sub-region 153, such as from its upper end or interface 155 to its lower end or interface 156. It is also possible, that the doping concentration increases stepwise from the upper sub-region 151, or the upper interface 155, to the middle sub-region 152, or to the first region 152-1 of the middle sub-region 152, and then increases monotonically to the lower sub-region 153, or the lower interface 156. The buffer region 150 can therefore have at least one step in the doping concentration followed by a monotonically increasing doping concentration.

Simulations have revealed that semiconductor devices having a buffer region 150 with the above defined thicknesses for the individual sub-regions 151 to 153 show an improved robustness against the impact of cosmic radiation while allowing to provide the semiconductor device with a low specific on-state resistance Ron·A in the active area 162. Each of the sub-regions 151 to 153 of the buffer region 150 may have a doping concentration as described above.

Semiconductor devices, such as MOS transistor devices may include parasitic internal devices. For example, the source region 131, the body region 132 and the drift region 134 form a parasitic (intrinsic) bipolar transistor. The body region 132 forms the base region of this parasitic bipolar transistor which can switch on, or latches up, under overcurrent conditions. Overcurrent conditions may occur as a consequence of cosmic radiation.

Under the influence of cosmic radiation, i.e. heavy ion impact, electron-hole pairs may be generated in the drift region 134. When the semiconductor device is in the blocking state, a strong electrical field is developed through the drift region 134. The charge carriers generated by the cosmic radiation are accelerated by the electrical field and may generate secondary electron-hole-pairs, i.e. secondary charge carriers, which may lead to the formation of so-called streamers. A streamer is a highly conductive electron-hole plasma path through the drift region 134. This process is also described as ion-induced avalanche generation.

If avalanche generation occurs, the generated holes may flow back to the source region and cause a voltage drop within the body region. If the voltage drop is large enough, the parasitic bipolar transistor is switched on, leading to a local self-sustained, destructive process, if the source-drain current is not limited externally. Since a bipolar transistor has a negative resistance dependency relative to the temperature, the current flowing through the parasitic bipolar transistor may locally heat the device and thus leads to a further increase of the current. The semiconductor material may locally melt. As a consequence, the local source-drain breakdown can lead to a global source-drain leakage current, and eventually to a complete loss of the drain-source blocking capability. These types of damages are referred to as single event breakdown (SEB), as the course of this damage is the heavy ion impact of the cosmic radiation.

The avalanche breakdown, irrespective whether it is caused by cosmic radiation or any other reason, can be described as primary breakdown. Without latching-up of the parasitic bipolar transistor, the primary breakdown is often tolerable. Latching up of the parasitic bipolar transistor with the thermal runaway can be described as secondary breakdown. Most semiconductor devices cannot tolerate a secondary breakdown.

Figure 5B:
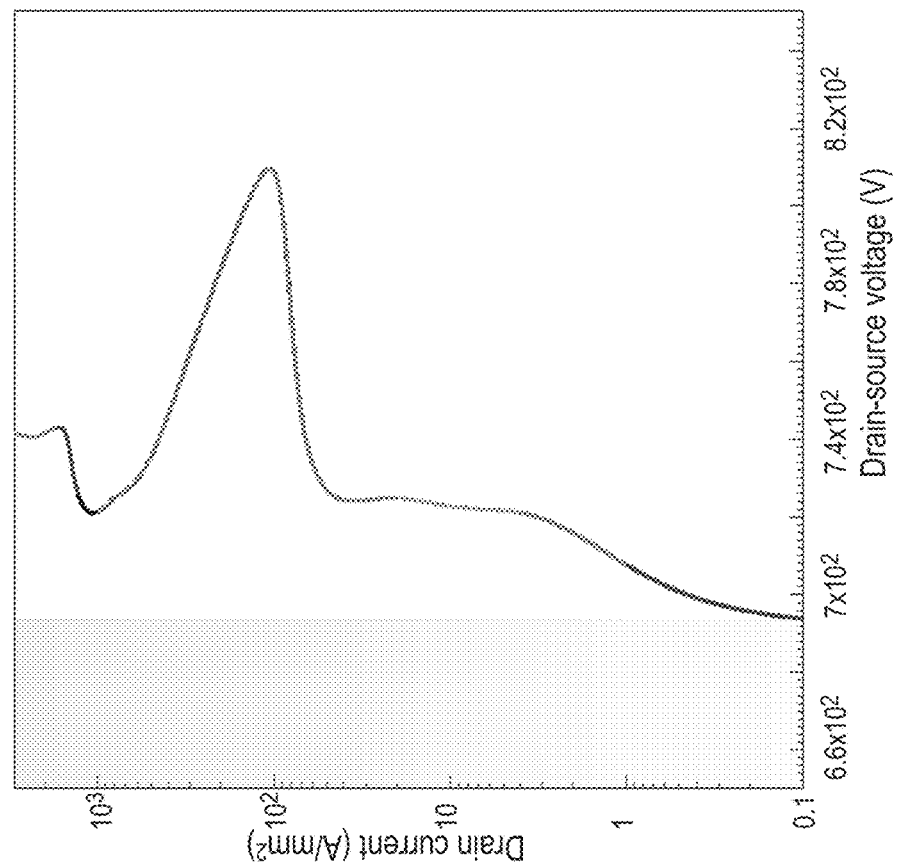
FIG. 5B illustrates the I-V characteristic of a semiconductor device according to an embodiment.
Figure 5A:
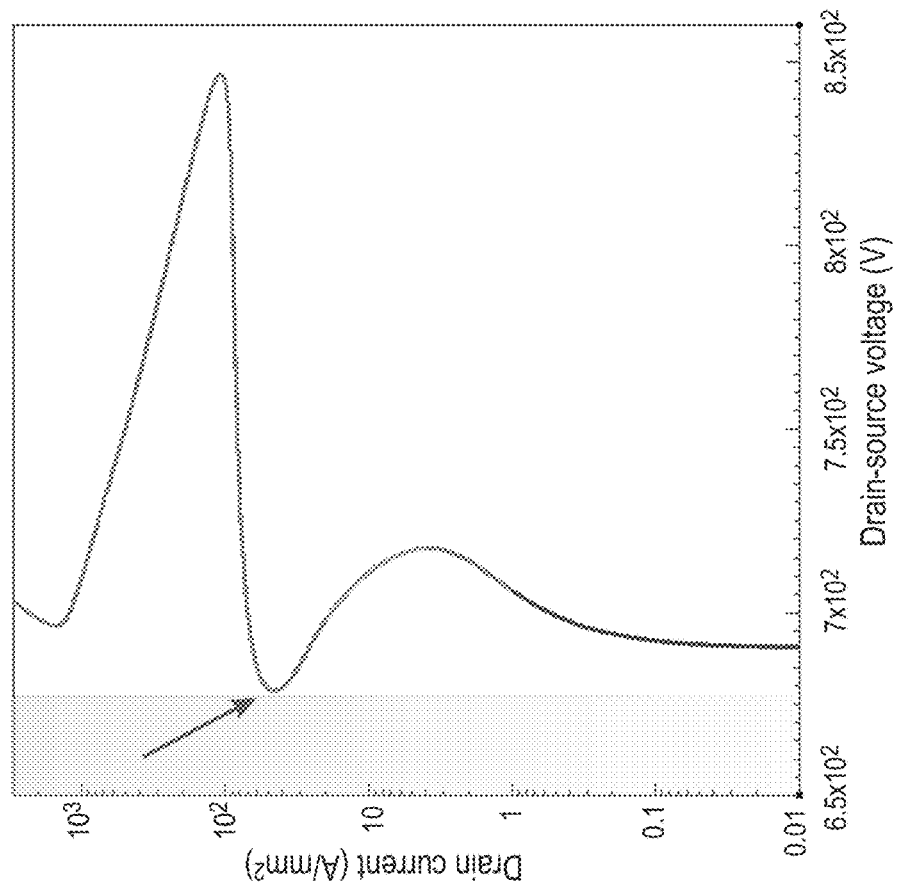
FIG. 5A illustrates the I-V characteristic (current-voltage characteristic) of a common semiconductor device.

FIG. 5A illustrates an I-V characteristic of a MOSFET having a buffer which contains only two sub-regions. An upper sub-region of this two-step buffer has a thickness of 3 μm and a doping concentration of $1 \times 10^{15}$ cm$^{-3}$, while a lower sub-region has a thickness of 21 μm and a doping concentration of $6 \times 10^{15}$ cm$^{-3}$.

With regard to the robustness of the semiconductor device relative to cosmic radiation, simulations have revealed that preventing the "first" snap-back, indicated in FIG. 5A by the arrow, to reduce below the static blocking voltage, increases the area of "available states" of the semiconductor device where cosmic radiation events do not lead to catastrophic destruction of the semiconductor devices. The area of "available states" is indicated in FIG. 5A by the grey area. The maximum voltage of the area of available states is limited by the low snap-back voltage. For voltages below the lowermost snap-back there are no high energy states and this voltage regime should be safe regarding cosmic radiation exposure. For higher voltages the high energy plasma generated by cosmic radiation can drive the device into the state, which triggers the parasitic bipolar transistor.

The drop of the source-drain voltage can be efficiently avoided, or at least shifted to higher current densities, if the buffer region 150 is provided with at least three different sub-regions 151, 152, 153 of increasing doping concentration from the drift region 134 towards the drain region 135. In practical implementations, the buffer region 150 may have three, four, or five different sub-regions with increasing doping concentration.

The different sub-regions 151, 152, 153 may be formed during deposition of the epitaxial layer 120. For example, each of the sub-region 151, 152, 153 can be intrinsically doped during epitaxial deposition. Another approach is carrying out epitaxial deposition stepwise and implanting dopants with a preselected dose after each deposition step. If an at least partially monotonically decreasing doping concentration from the drain region 135 towards the drift region 134 is desired, intrinsically doping during epitaxial deposition may be used since the concentration of the doping gas can be gradually decreased during deposition. For a stepwise doping concentration profile of the buffer region 150, intrinsic doping as well as stepwise deposition and implantation can be used.

According to an embodiment, the buffer region 150 does not contain more than five different sub-regions of different doping concentration to keep the manufacturing costs low.

An exemplary embodiment of a semiconductor device may include a buffer region 150 having a lower sub-region 153 with a thickness of about 4 μm and a doping concentration of about $1 \times 10^{17}$ cm$^{-3}$, a middle sub-region 152 with a thickness of about 12 μm and a doping concentration of about $6 \times 10^{15}$ cm$^{-3}$, and an upper sub-region 151 with a thickness of about 8 μm and a doping concentration of about $3 \times 10^{15}$ cm$^{-3}$. FIG. 5B illustrates the simulated I-V characteristic of this semiconductor device having an increased area of available states up to the static blocking voltage since the snap-back is prevented.

Without wishing to be tight by theory, analysis of the MOSFET failure due to cosmic radiation has revealed that two aspects may have a significant influence: base resistance of the parasitic bipolar transistor (BJT) and the thickness and doping level of the buffer region. From a practical perspective, both aspects should be considered when designing a robust device. In order to reduce the impact of the parasitic bipolar transistor, the limitation $$\frac{dV_{DS}}{dt} \left( \sim \frac{V_{BE(BJT)}}{R_{p++} \cdot C_{DS}} \right)$$

should be overcome, with $V_{DS}$ being the source-drain voltage, $V_{BE(BJT)}$ being the base-emitter voltage of the parasitic bipolar transistor, $R_{p++}$ being the resistance of the body region, and $C_{DS}$ being the source-drain capacitance.

A simple increase of the doping concentration in the parasitic bipolar transistor base, i.e. of the body region, to reduce its resistance, is not generally possible as a moderately doped body region is desired for a having a moderate gate-source threshold voltage $V_{GSth}$ and to provide the MOSFET with a desired transfer characteristics. By using a tilted source implantation, the influence of the body region implantation process may be reduced.

However, not much attention has been paid so far on the influence of the buffer region 150 on the robustness of semiconductor devices against cosmic radiation and the suitable dimensioning of the buffer region 150 to increase the robustness, particularly relative to the snap-back and latching-up of the parasitic bipolar transistor. The buffer region 150 is arranged between the compensation region 133 and the substrate 110, or drain region 135. Its thickness and its resistivity affect the secondary breakdown of the device, which correlates with measured failure rates in tests for evaluating the radiation hardness of semiconductor devices. Although a thick and low doped buffer region would ensure a good robustness of the device against cosmic radiation, this approach is often not a practicable solution due to corresponding increase of the specific on state resistance Ron·A in an active area of the semiconductor device, especially since with the progress in production technologies the doping of the charge compensation region 133 and the drift region 134 can be increased to such high values that the Ron*A is lower than 1 Ohm mm$^2$ so that the Ron of the buffer region 150 becomes a dominant factor compared to the Ron of the drift region 134.

For evaluating the influence of the buffer region 150 on the device robustness, particularly on the secondary breakdown, quasi-stationary avalanche simulations may be used. The simulations consider the change of the electrical field distribution under reverse conditions and at different current densities.

A MOSFET can tolerate low current densities at high blocking voltages. The blocking voltage is mainly relieved within the drift region 134 at low current densities. In case of charge compensation devices, the charge compensation regions 133, or p-columns, contribute to the depletion of the drift regions 134, or n-columns, so that the electrical field caused by the blocking voltage can be taken up completely by the drift region 134.

When a cosmic radiation event occurs, a streamer may be formed within the drift region 134 leading to a temporary generation of charge carriers forming a plasma path. The charge carriers may recombine. Since the streamer temporarily reduces the resistance within the drift region 134, the electrical field distribution changes between source region 131 and drain region 135, and the electrical field within the buffer region 150 increases. Due to Egawa effect, a local field exaggeration may occur at junctions between regions of different doping concentration leading to a "snap back" of the I-V characteristic of the semiconductor device. The local field exaggeration may occur at the junction between the drift region 134 and the upper sub-region 151 of the buffer region 150 or at the junctions between the sub-regions of the buffer region 150.

Figure 6A:
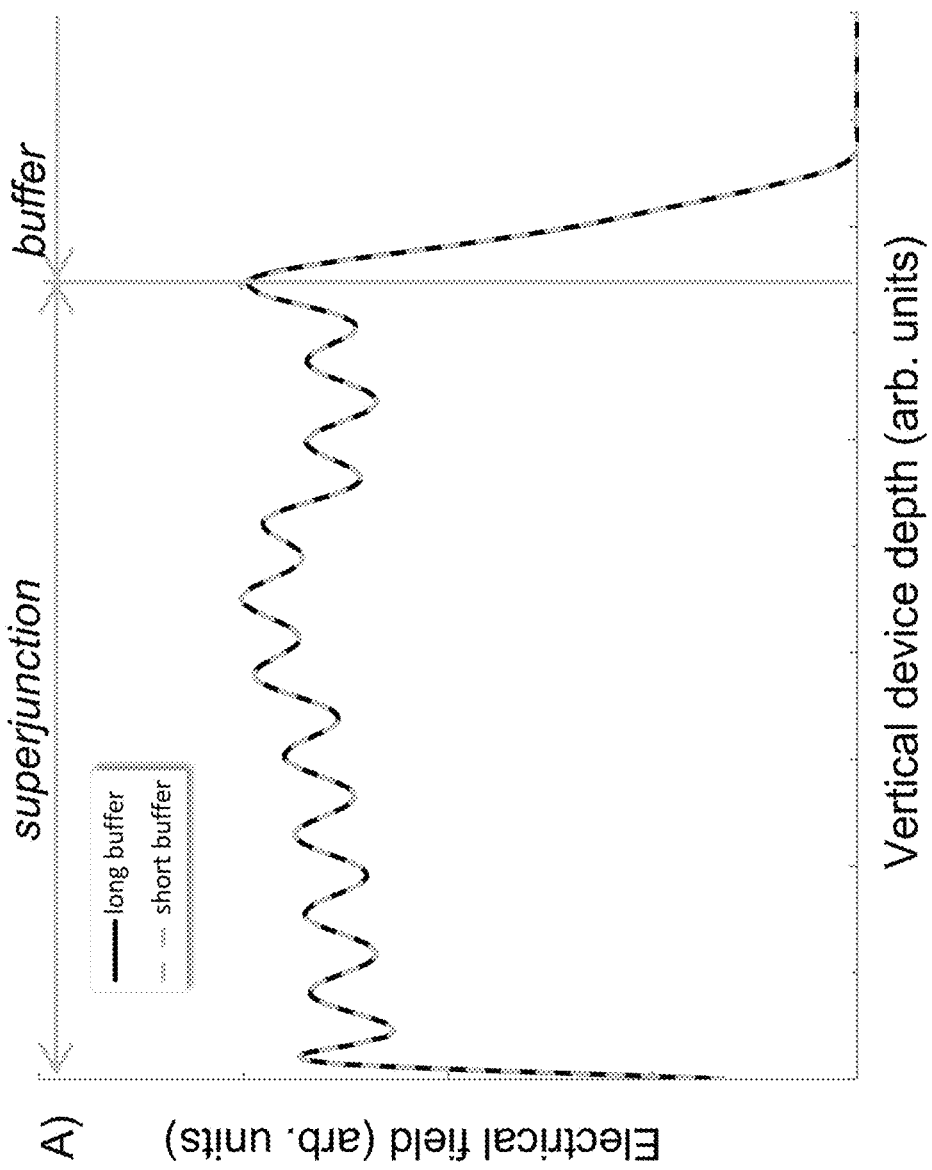
FIG. 6A illustrates the electrical field distribution along the pn-junction of the charge compensation region in a vertical direction under non-conductive conditions at a given blocking voltage.
Figure 6B:
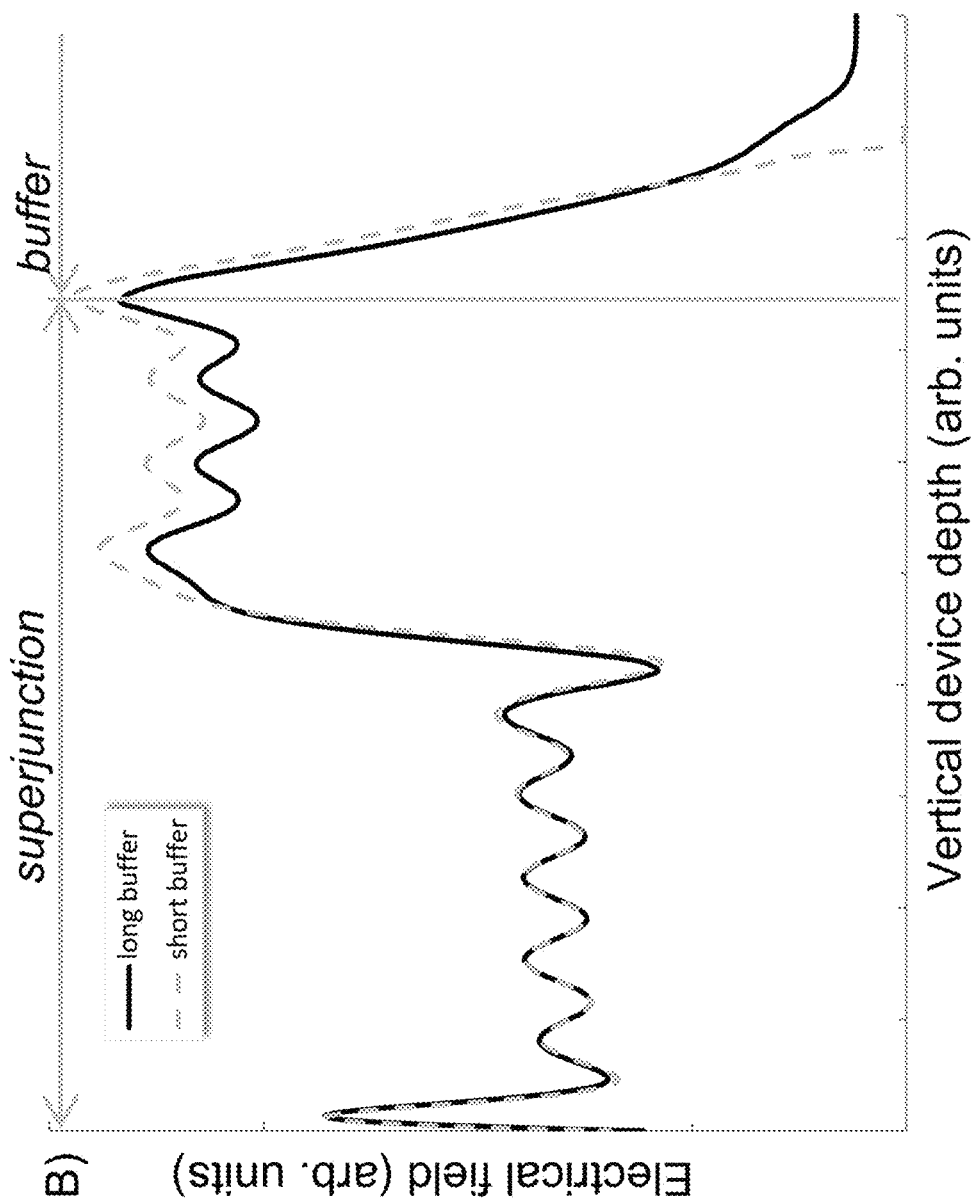
FIG. 6B illustrates the electrical field distribution along the pn-junction of the charge compensation region in a vertical direction under non-conductive conditions and the given blocking voltage as in FIG. 6A but under the influence of an additional streamer.

FIG. 6A illustrate the situation before the cosmic radiation event while FIG. 6B illustrates the situation after formation of the streamer. The semiconductor device is in blocking mode and the blocking voltage mainly drops over the drift region, indicated in FIGS. 6A and 6B as "superjunction", as shown by the high electrical field within the drift region.

The streamer is formed in the area within the drift region where the electrical field is significantly reduced since the streamer is a region of increased conductivity. To compensate this, the electrical field must increase in other areas. At the junction between the drift region and the buffer, a local field exaggeration occurs which is more pronounced for "short" buffers which do not have three sub-regions as explained above. When providing the semiconductor device with a buffer with at least three sub-regions, referred to in FIGS. 6A and 6B as "long" buffer, the local field exaggeration can be reduced.

In addition to that, the doping concentration of the respective sub-regions 151, 152, 153 are tailored such that the resistance of the buffer region 150 is not increased, so that the total Ron can even further be reduced. A reduction of several percent such as 5%, or at least 10% in Ron relative to semiconductor devices having only a two-step buffer regions can be obtained.

Figure 7:
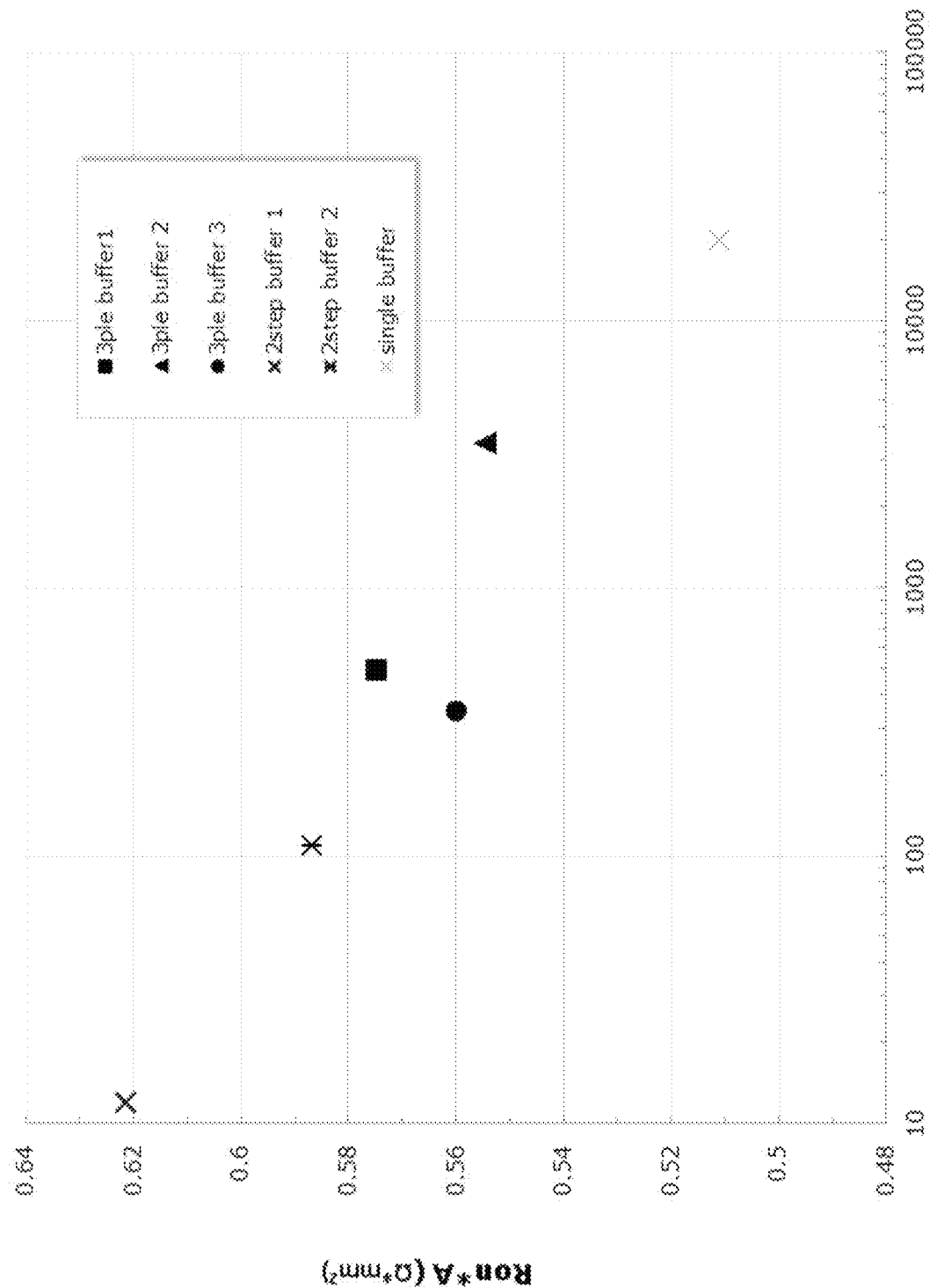
FIG. 7 illustrates the specific resistance Ron·A as a function of failure in time (FIT).

The interplay between the device robustness against cosmic radiation events and the Ron·A in the active area of a semiconductor device is illustrated in FIG. 7. Ron·A is plotted relative to the FIT (failure in time) rates at the maximum operational blocking voltage of a 600 V MOSFET. The maximum operational blocking voltage of this device is 470 V. FIT means number of failures in $10^9$ hours. FIT is in logarithmic scale.

Different semiconductor devices of same maximum operational blocking voltage of a 600 V MOSFET but having different buffers were tested, according to the following table 1.

TABLE 1

| 3ple buffer 1 | 16 µm @ 1 × $10^{16}$ cm$^{-3}$ | 5 µm @ 6 × $10^{15}$ cm$^{-3}$ | 3 µm @ 1 × $10^{15}$ cm$^{-3}$ |
|---|---|---|---|
| 3ple buffer 2 | 16 µm @ 1.5 × $10^{16}$ cm$^{-3}$ | 5 µm @ 6 × $10^{15}$ cm$^{-3}$ | 3 µm @ 1 × $10^{15}$ cm$^{-3}$ |
| 3ple buffer 3 | 4 µm @ 1 × $10^{17}$ cm$^{-3}$ | 14 µm @ 1 × $10^{16}$ cm$^{-3}$ | 6 µm @ 3 × $10^{15}$ cm$^{-3}$ |
| 2step buffer 1 | 16 µm @ 6 × $10^{15}$ cm$^{-3}$ | | 8 µm @ 3 × $10^{15}$ cm$^{-3}$ |
| 2step buffer 2 | 16 µm @ 1 × $10^{16}$ cm$^{-3}$ | | 8 µm @ 3 × $10^{15}$ cm$^{-3}$ |
| single buffer | | 8 µm @ 3 × $10^{15}$ cm$^{-3}$ | |

As shown in FIG. 7, semiconductor devices having a two-step buffer may show a low FIT rate. However, this comes with a high Ron·A rendering those devices unsuitable for many applications. The single buffer device has a low Ron·A but a very high FIT rate, thus the single buffer device has a high risk to fail.

When using a three-step buffer, i.e. a buffer having at least three sub-regions of different doping concentration, a compromise can be found between Ron·A and the device robustness against failure due to cosmic radiation events.

According to an embodiment, the buffer region 150 has at least the lower sub-region 153 adjoining the drain region 135, wherein the lower sub-region 153 has a thickness of equal to or higher than 3 µm and equal to or lower than 12 µm and has a doping concentration lower than the doping concentration of the drain region 135, the upper sub-region 151 adjoining the drift region 134, wherein the upper sub-region has a thickness of equal to or higher than 3 µm and equal to or lower than 10 µm, and the middle sub-region 152 arranged between the lower sub-region 153 and the upper sub-region 151, wherein the middle sub-region 152 has a thickness of equal to or higher than 8 µm and equal to or lower 20 µm and has a doping concentration lower than the doping concentration of the lower sub-region 153 and higher than the doping concentration of the upper sub-region 151.

The above results may also be achieved by a buffer having at least three sub-regions with the above given thickness relations as long as the doping concentrations increases from the upper sub-region 151 to the lower sub-region 153.

The lower sub-region can optionally have a doping concentration of equal to or higher than 5×$10^{16}$ cm$^{-3}$ and equal to or lower 8×$10^{17}$ cm$^{-3}$.

The middle sub-region can optionally have a doping concentration of equal to or higher than 5×$10^{15}$ cm$^{-3}$ and equal to or lower 5×$10^{16}$ cm$^{-3}$.

The upper sub-region can optionally have a doping concentration of equal to or higher than 1×$10^{15}$ cm$^{-3}$ and equal to or lower 1×$10^{16}$ cm$^{-3}$.

Similar results can be obtained if the doping concentration of the buffer region 150 monotonically increases. According to an embodiment, a semiconductor device includes a semiconductor body 100 with a drain region 135 of a first conductivity type, a drift region 134 of the first conductivity type, wherein the drift region 134 has a doping concentration lower than a doping concentration of the drain region 135, a buffer region 150 of the first conductivity type, wherein the buffer region 150 is arranged between the drift region 134 and the drain region 135 and forms an upper interface 155 with the drift region 134 and a lower interface 156 with the drain region 135, a source region 131 of the first conductivity type, a body region 132 of a second conductivity type, wherein the body region 132 is arranged between the source region 131 and the drift region 134 and forms a first pn-junction with the source region 131 and a second pn-junction with the drift region 134, and a charge compensation region 133 of the second conductivity type, wherein the charge compensation region 133 extending from the body region 132 towards the buffer region 150. A source metallization 145 is formed in ohmic contact with the source region 131, and a drain metallization 146 is formed in ohmic contact with the drain region 135. The buffer region 150 can have a thickness of equal to or higher than 14 µm and equal to or lower than 42 µm, wherein the buffer region 150 may have a doping concentration which monotonically increases from the upper interface 155 to the lower interface 156.

The upper interface 155 and the lower interface 156 are shown in FIG. 1.

According to an embodiment, a method for manufacturing a semiconductor device includes providing a semiconductor body and forming, in the semiconductor body, a drain region 135 of a first conductivity type, a drift region 134 of the first conductivity type, wherein the drift region 134 has a doping concentration lower than a doping concentration of the drain region 135, a buffer region 150 of the first conductivity type to be arranged between the drift region 134 and the drain region 135, a source region 131 of the first conductivity type, a body region 132 of a second conductivity type, wherein the body region 132 is arranged between the source region 131 and the drift region 134 and forms a first pn-junction with the source region 131 and a second pn-junction with the drift region 134, and a charge compensation region 133 of the second conductivity type which extends from the body region 132 towards the buffer region 150. The method may further includes forming a source metallization 145 in ohmic contact with the source region 131; and a drain metallization 146 in ohmic contact with the drain region 135. The buffer region 150 is formed to include at least a lower sub-region 153 adjoining the drain region 135, wherein the lower sub-region 153 has a doping concentration equal to or higher than $5\times10^{16}$ cm$^{-3}$ and equal to or lower than $8\times10^{17}$ cm$^{-3}$, an upper sub-region 151 adjoining the drift region 134, wherein the upper sub-region 151 has a doping concentration of equal to or higher than $1\times10^{15}$ cm$^{-3}$ and equal to or lower than $1\times10^{16}$ cm$^{-3}$, and a middle sub-region 152 arranged between the lower sub-region 153 and the upper sub-region 151, wherein the middle sub-region 152 has a doping concentration of equal to or higher than $5\times10^{15}$ cm$^{-3}$ and equal to or lower than $5\times10^{16}$ cm$^{-3}$.

According to an embodiment, providing the semiconductor body 100 may include providing a semiconductor substrate 110 and forming an epitaxial layer 120 on the semiconductor substrate 110. The drain region 135 may be formed within the semiconductor substrate 110. The buffer region 150, the drift region 134, the charge compensation region 133, the body region 132 and the source region 131 may be formed within the epitaxial layer 120.

With the above range of variations of embodiments in mind, it should be understood that the present invention is not limited by the foregoing description nor is it intended to be limited by the accompanying drawings. Instead, the present invention is limited only by the following claims and their legal equivalents.

REFERENCE LIST 100 semiconductor body
110 semiconductor substrate
111 first side
112 second side
120 epitaxial layer
121 charge compensation structure
131 source region
132 body region
133 charge compensation region
134 drift region
135 drain region
138 channel region
141 gate dielectric
142 gate electrode
143 insulation layer
144 source contact
145 source metallization
146 drain metallization
150 buffer region
151 upper sub-region
152 middle sub-region
151-1 first region of middle sub-region
152-2 second region of middle sub-region
153 lower sub-region
155 virtual line defining lower limit of drift region and charge compensation region/upper interface
156 lower interface
161 peripheral area/edge termination region
162 active area
C transistor cell

What is claimed is:
1. A semiconductor device, comprising:
a semiconductor body comprising, a drain region of a first conductivity type, a drift region of the first conductivity type and having a doping concentration lower than a doping concentration of the drain region, a buffer region of the first conductivity type arranged between the drift region and the drain region, a source region of the first conductivity type, a body region of a second conductivity type arranged between the source region and the drift region, wherein the body region forms a first pn-junction with the source region and a second pn-junction with the drift region, and a charge compensation region of the second conductivity type extending from the body region towards the buffer region;
a source metallization in ohmic contact with the source region; and
a drain metallization in ohmic contact with the drain region,
wherein the buffer region comprises at least a lower sub-region adjoining the drain region, the lower sub-region having a doping concentration equal to or higher than $5\times10^{16}$ cm$^{-3}$ and equal to or lower than $8\times10^{17}$ cm$^{-3}$, an upper sub-region adjoining the drift region, the upper sub-region having a doping concentration of equal to or higher than $1\times10^{15}$ cm$^{-3}$ and equal to or lower than $1\times10^{16}$ cm$^{-3}$, and a middle sub-region arranged between the lower sub-region and the upper sub-region, the middle sub-region having a doping concentration of equal to or higher than $5\times10^{15}$ cm$^{-3}$ and equal to or lower than $5\times10^{16}$ cm$^{-3}$.

2. The semiconductor device of claim 1, wherein the upper sub-region of the buffer region has a thickness of equal to or higher than 3 µm and equal to or lower than 12 µm.

3. The semiconductor device of claim 1, wherein the middle sub-region of the buffer region has a thickness of equal to or higher than 8 µm and equal to or lower than 20 µm.

4. The semiconductor device of claim 1, wherein the lower sub-region of the buffer region has a thickness of equal to or higher than 3 µm and equal to or lower than 10 µm.

5. The semiconductor device of claim 1, wherein the middle sub-region of the buffer region comprises at least a first region adjoining the upper sub-region and having a thickness of at least 3 µm, and a second region adjoining the lower sub-region and having a thickness of at least 3 µm, and wherein a doping concentration of the middle sub-region increases from the first region to the second region.

6. The semiconductor device of claim 1, wherein the semiconductor body comprises a semiconductor substrate including the drain region and an epitaxial layer on the semiconductor substrate, the epitaxial layer comprising the buffer region, the drift region, the charge compensation region, the body region and the source region.

7. The semiconductor device of claim 1, wherein the semiconductor device has a specific on-state resistance Ron·A in an active area of the semiconductor device of equal to or lower than 1 Ohm·mm$^2$.

8. The semiconductor device of claim 1, wherein the doping concentration of the buffer region monotonically increases from upper sub-region to the lower sub-region.

9. The semiconductor device of claim 1, wherein the semiconductor device comprises a plurality of charge compensation regions and drift regions which are alternatingly arranged in a lateral direction.

10. A semiconductor device, comprising:
a semiconductor body comprising a drain region of a first conductivity type, a drift region of the first conductivity type and having a doping concentration lower than a doping concentration of the drain region, a buffer region of the first conductivity type arranged between the drift region and the drain region, a source region of the first conductivity type, a body region of a second conductivity type arranged between the source region and the drift region, wherein the body region forms a first pn-junction with the source region and a second pn-junction with the drift region, and a charge compensation region of the second conductivity type extending from the body region towards the buffer region;
a source metallization in ohmic contact with the source region; and
a drain metallization in ohmic contact with the drain region,
wherein the buffer region comprises at least a lower sub-region adjoining the drain region and having a thickness of equal to or higher than 3 µm and equal to or lower than 12 pm and having a doping concentration lower than the doping concentration of the drain region, an upper sub-region adjoining the drift region having a thickness of equal to or higher than 3 µm and equal to or lower than 10 pm, and a middle sub-region arranged between the lower sub-region and the upper sub-region and having a thickness of equal to or higher than 8 µm and equal to or lower 20 pm and having a doping concentration lower than the doping concentration of the lower sub-region and higher than the doping concentration of the upper sub-region.

11. The semiconductor device of claim 10, wherein the middle sub-region of the buffer region comprises at least a first region adjoining the upper sub-region and having a thickness of at least 3 µm, and a second region adjoining the lower sub-region and having a thickness of at least 3 µm, and wherein a doping concentration of the middle sub-region increases from the first region to the second region.

12. The semiconductor device of claim 10, wherein the lower sub-region has a doping concentration of equal to or higher than $5\times10^{16}$ cm$^{-3}$ and equal to or lower $8\times10^{17}$ cm$^{-3}$.

13. The semiconductor device of claim 10, wherein the middle sub-region has a doping concentration of equal to or higher than $5\times10^{15}$ cm$^{-3}$ and equal to or lower $5\times10^{16}$ cm$^{-3}$.

14. The semiconductor device of claim 10, wherein the upper sub-region has a doping concentration of equal to or higher than $1\times10^{15}$ cm$^{-3}$ and equal to or lower $1\times10^{16}$ cm$^{-3}$.

15. The semiconductor device of claim 10, wherein the semiconductor device has a specific on-state resistance Ron·md A in an active area of the semiconductor device of equal to or lower than 1 Ohm·mm$^2$.

16. A semiconductor device, comprising:
a semiconductor body comprising a drain region of a first conductivity type, a drift region of the first conductivity type and having a doping concentration lower than a doping concentration of the drain region, a buffer region of the first conductivity type and arranged between the drift region and the drain region, wherein the buffer region forms an upper interface with the drift region and a lower interface with the drain region, a source region of the first conductivity type, a body region of a second conductivity type and being arranged between the source region and the drift region, wherein the body region forms a first pn-junction with the source region and a second pn-junction with the drift region, and a charge compensation region of the second conductivity type and extending from the body region towards the buffer region;
a source metallization in ohmic contact with the source region; and
a drain metallization in ohmic contact with the drain region,
wherein the buffer region has a thickness of equal to or higher than 14 µm and equal to or lower than 42 µm,
wherein the buffer region has a doping concentration which monotonically increases from the upper interface to the lower interface.

17. The semiconductor device of claim 16, wherein the semiconductor device has a specific on-state resistance Ron·A in an active area of the semiconductor device of equal to or lower than 1 Ohm·mm$^2$.

* * * * *